(12) United States Patent
Zieren et al.

(10) Patent No.: US 8,981,442 B2
(45) Date of Patent: Mar. 17, 2015

(54) SEMICONDUCTOR MAGNETIC FIELD SENSORS

(71) Applicant: NXP B.V., Eindhoven (NL)

(72) Inventors: Victor Zieren, Eindhoven (NL); Anco Heringa, Waalre (NL); Olaf Wunnicke, Eindhoven (NL); Jan Slotboom, Eersel (NL); Robert Hendrikus Margaretha van Veldhoven, Dommelen (NL); Jan Claes, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/108,106

(22) Filed: Dec. 16, 2013

(65) Prior Publication Data
US 2014/0175528 A1  Jun. 26, 2014

(30) Foreign Application Priority Data
Dec. 20, 2012  (EP) .................................. 12198395

(51) Int. Cl.
*H01L 29/82* (2006.01)
*H01L 43/02* (2006.01)
*G01R 33/06* (2006.01)
*H01L 29/735* (2006.01)
*H01L 29/861* (2006.01)

(52) U.S. Cl.
CPC .............. *H01L 43/02* (2013.01); *G01R 33/066* (2013.01); *H01L 29/82* (2013.01); *H01L 29/735* (2013.01); *H01L 29/8611* (2013.01)
USPC ..... 257/295; 257/421; 257/427; 257/E29.323

(58) Field of Classification Search
CPC ..... H01L 43/08; H01L 29/82; H01L 23/5226; H01L 23/528; H01L 27/222; H01L 43/065; G11C 11/16

USPC ............... 257/295, 421–427, E29.323; 438/3
See application file for complete search history.

(56) References Cited

U.S. PATENT DOCUMENTS

| 4,100,563 A | 7/1978 | Clark |
| 2008/0074364 A1* | 3/2008 | Lara-Ascorra et al. ......... 345/82 |

FOREIGN PATENT DOCUMENTS

| EP | 0 671 773 A2 | 9/1995 |
| EP | 2 203 756 B1 | 7/2010 |
| GB | 2 126 009 A | 3/1984 |

OTHER PUBLICATIONS

Castagnetti, R. et al, Dual Collector Magnetotransistors with On-Chip Bias and Signal Conditioning Circuitry, Sensors and Actuators A, vol. 37-38, pp. 698-702 (Jun. 1, 1993).

(Continued)

*Primary Examiner* — Jami M Valentine

(57) ABSTRACT

A semiconductor magnetic field sensor comprising a semiconductor well on top of a substrate layer is disclosed. The semiconductor well includes a first current collecting region and a second current collecting region and a current emitting region placed between the first current collecting region and the second current collecting region. The semiconductor well also includes a first MOS structure, having a first gate terminal, located between the first current collecting region and the current emitting region and a second MOS structure, having a second gate terminal, located between the current emitting region and the second current collecting region. In operation, the first gate terminal and the second gate terminal are biased for increasing a deflection length of a first current and of a second current. The deflection length is perpendicular to a plane defined by a surface of the semiconductor magnetic field sensor and parallel to a magnetic field.

15 Claims, 11 Drawing Sheets

(56) References Cited

OTHER PUBLICATIONS

Guvench, M. G. et al. "Surface Related Degradation of Sensitivity in Lateral Transistor Magnetic Sensors", Proceedings of the Thirteenth Biennial University/Government/Industry Microelectronics Symposium, pp. 142-145 (Jun. 20, 1999).

Extended European Search Report for EP Patent Appln. No. 12198395.1 (May 22, 2013).

* cited by examiner

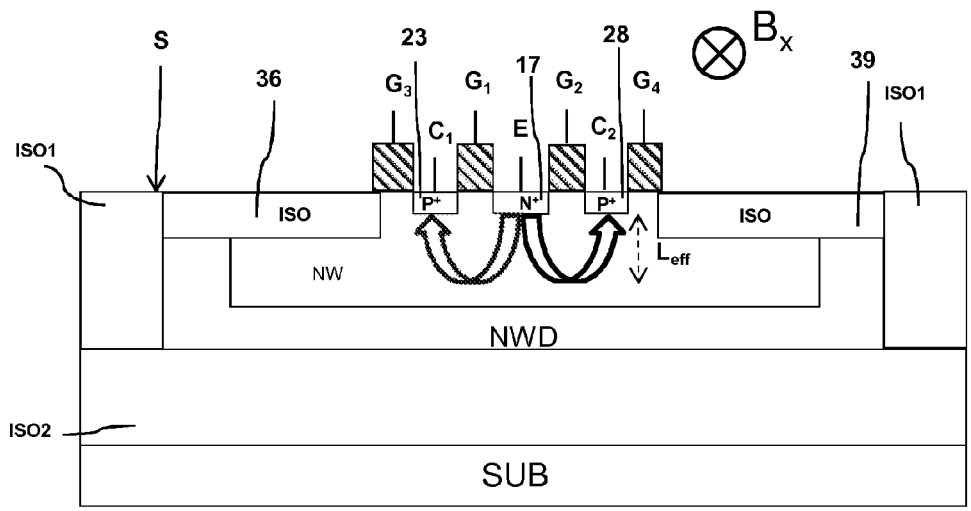
FIG. 9a
FIG. 9b
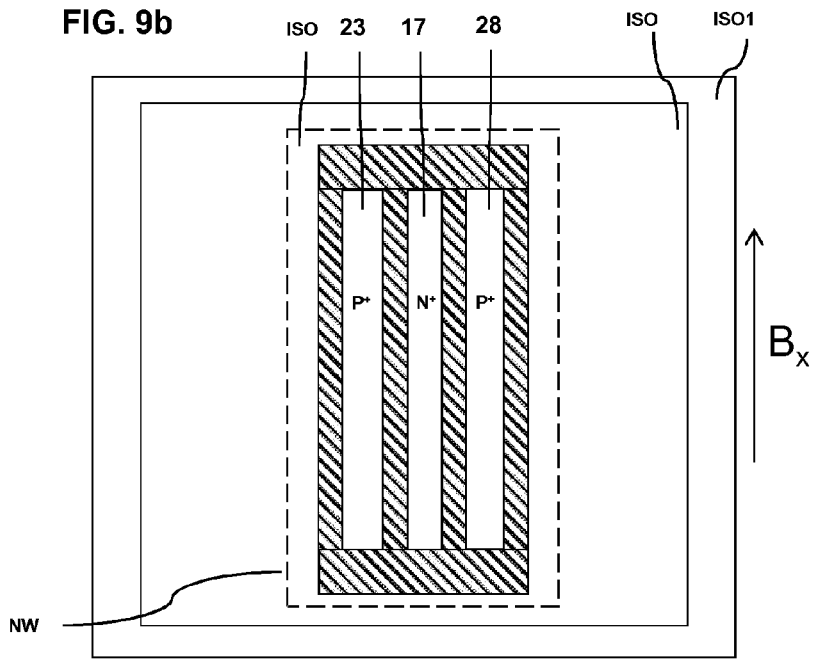
FIG. 9c

SEMICONDUCTOR MAGNETIC FIELD SENSORS

CROSS-REFERENCE TO RELATED APPLICATIONS

This application claims the priority under 35 U.S.C. §119 of European patent application no. 12198395.1, filed on Dec. 20, 2012, the contents of which are incorporated by reference herein.

FIELD OF THE INVENTION

The invention relates to semiconductor magnetic field sensors.

BACKGROUND ART

Semiconductor magnetic field sensors are devices sensitive to a magnetic field (H) or to a magnetic induction (B). Semiconductor magnetic field sensors are often implemented in automotive applications, because magnetic fields penetrate easily through most materials. Semiconductor magnetic field sensors are used in a variety of applications such as brushless-DC motors, angular sensors, current sensors, engine and transmission sensors, ABS (Anti-lock Braking System) sensors, magnetic parking sensors, etc. for improving comfort and safety.

Semiconductor magnetic field sensors may be sensitive to magnetic fields perpendicular or parallel to a plane of a semiconductor chip. The semiconductor magnetic field sensors sensitive to magnetic fields parallel to the plane of the chip may be more attractive for practical use because the magnetic field sensitive structures may be placed at different angles on the surface of the semiconductor chip for sensing magnetic fields at different directions of the chip plane.

Semiconductor magnetic field sensors based on lateral structures may be of different types. They may be: (a) bipolar magnetotransistors (MTs), consisting of two or more collectors and at least one emitter somewhere in between the collectors; (b) magnetodiodes (MDs), consisting of two or more current-collecting contacts (collectors) and at least one current-emitting contact (emitter) somewhere in between the collectors; (c) magnetoresistors (MRs), consisting of two or more current collecting contacts (collectors) and at least one current-emitting contact (emitter) somewhere in between the collectors. Magnetodiodes (MDs) and magnetoresistors (MRs) have no base region, nor base contacts, such as present in magnetotransistors (MTs).

Many semiconductor magnetic field sensors suffer from the imperfections with which they are fabricated. These imperfections may be caused by material asymmetries (e.g. not uniform doping of the silicon, presence of impurities or crystal defects).

In most (modern) semiconductor technologies special integrated features are provided to prevent current leakage between two adjacent semiconductor device components. These features are best known as Shallow Trench Isolations (STI). Shallow trench isolations are manufactured early during the semiconductor device fabrication by etching a part of the silicon, growing first a thin layer of a dielectric material (e.g. silicon dioxide or silicon nitride) and subsequently depositing a thicker layer of the dielectric material to fill the etched part (so-called trench). While these STI are particularly advantageous in isolating semiconductor device components from each other and in reducing the effect of parasitic coupling, STI may be one of the causes of material asymmetries in the fabrication of semiconductor magnetic field sensors. These imperfections cause an offset in the detection of magnetic fields (e.g., a semiconductor magnetic field sensor would give a non-zero output in the absence of a magnetic field). This offset degrades the accuracy of the semiconductor magnetic field sensors and needs to be compensated with additional calibration circuitry.

In addition to offset, lateral semiconductor magnetic field sensors might also suffer from low sensitivity problems. Sensitivity in lateral semiconductor magnetic field sensors is a measure of the response of a lateral semiconductor magnetic field sensor to an applied magnetic field (H) or magnetic induction (B). A lateral semiconductor magnetic field sensor with higher sensitivity is desirable because it is able to respond to a smaller applied magnetic field (H) or magnetic induction (B) with better accuracy.

GB2126009A discloses a semiconductor magnetic field sensor comprising a lateral bipolar magnetotransistor having only one single emitter region and a base region. The base region is heavily doped with impurity atoms, and is incorporated in the surface of a silicon substrate that is lightly doped with impurity atoms. The emitter region, collector regions and the base region of the magnetotransistor are adjacently aligned. This magnetotransistor suffers of low sensitivity because of a parasitic current that is lost through the lightly doped substrate and cannot be deflected by the magnetic field.

SUMMARY OF THE INVENTION

One of the objects of the invention is to at least diminish the drawbacks of existing semiconductor magnetic field sensors.

According to the invention this object is achieved by a semiconductor magnetic field sensor comprising:

a semiconductor well on top of a substrate layer comprising:
  a first current collecting region and a second current collecting region, and
  a current emitting region placed between the first current collecting region and the second current collecting region,
a first MOS structure, having a first gate terminal, located between the first current collecting region and the current emitting region,
a second MOS structure, having a second gate terminal, located between the current emitting region and the second collector,
wherein, in operation, the first gate terminal and the second gate terminal are biased for increasing a deflection length of a first current and a second current, wherein the deflection length is perpendicular to a plane defined by a surface of the semiconductor magnetic field sensor and parallel to a magnetic field, wherein the first current and the second current flow in the semiconductor well from the current emitting region to the first current collecting region and the second current collecting region, and wherein a difference between the first current and the second current is dependent on the magnetic field.

By having a current emitting region placed between a first and a second current collecting region and by having properly biased MOS structures between the current emitting region and the current collecting regions, a first and a second current flowing in the semiconductor well generated during the operation of the semiconductor magnetic field sensor and deflected by the magnetic field, are deflected in a direction perpendicular to a plane defined by a surface of the semiconductor magnetic field sensor and parallel to a direction of the magnetic field. In order to achieve this effect the MOS structures have correspondent gate terminals for biasing them. In some embodiments the gate terminals need to be biased for inducing accumulation of majority carriers in the semiconductor well underneath the MOS structures and in some other embodiments the gate terminals need to be biased for creating a depletion region in the semiconductor well underneath the MOS structures. The increase of the perpendicular deflection of the currents enhances the response of the semiconductor magnetic field sensor to an applied magnetic field for a given emitter input bias current.

The use of MOS structures ensures clean interfaces between the current emitting region, the current collecting regions and the MOS structures, avoiding the formation of material imperfections, defects or interface states that cause an imbalance in the first and the second currents even in the absence of a magnetic field.

In an embodiment, the semiconductor magnetic field sensor may further comprise an insulation layer between the substrate layer and the semiconductor well. In this way leakage currents flowing from the semiconductor well to the substrate are prevented and a better response of the semiconductor magnetic field sensor to an applied magnetic field may be obtained.

In an embodiment, the semiconductor magnetic field sensor may further comprise a semiconductor layer on top of the insulation layer and below the semiconductor well. The semiconductor layer is contacted through heavily doped regions to external terminals. By proper biasing the semiconductor layer with respect to the semiconductor well, imperfections in the interfaces between the insulation layer and the semiconductor layer may have less detrimental effects on the response of the semiconductor magnetic field. In this way a further imbalance in the first and the second currents in the absence of a magnetic field may be prevented.

The semiconductor magnetic field sensor may comprise multiple biased MOS structures between the current emitting region and the current collecting regions. In this way a more vertical deflection of the collector currents is obtained.

The semiconductor magnetic field sensor may alternatively comprise multiple heavily doped base contact regions for contacting the semiconductor well. These heavily doped base contact regions may be located between the current collecting regions and the current emitting region. In this case the first and second current collecting regions, the current emitting region and the semiconductor well contacted by the heavily doped base contact regions act as a first and second collector regions, emitter region and base region respectively of a lateral bipolar magnetotransistor. The currents flowing during operation of the semiconductor magnetic field sensor from the emitter region towards the first and second collector regions are a first and a second collector current. A difference between the first and the second collector current is a measure of the applied magnetic field. In lateral bipolar magnetotransistors the deflection of the first and second collector current perpendicular to the direction of the magnetic field is increased by biasing the gate terminals of the correspondent MOS structures with a voltage that may be negative or positive with respect to the voltage applied to the semiconductor well (e.g. by means of the base contact regions). The voltage applied to the gate terminals may be negative with respect to the voltage applied to the semiconductor well if the semiconductor well is a p-type doped semiconductor well and the emitter and collector regions are n-type doped regions. In this case the lateral bipolar transistor is a lateral NPN bipolar magnetotransistor and an accumulation of holes (i.e. majority carriers in the p-type doped semiconductor well) is generated underneath the MOS structures. The voltage applied to the gate terminals is positive with respect to the voltage applied to the semiconductor well if the semiconductor well is a n-type doped semiconductor well and the emitter and collector regions are p-type doped regions. In this latter case the lateral bipolar transistor is a lateral PNP bipolar magnetotransistor and an accumulation of electrons (i.e. majority carriers in the n-type doped semiconductor well) is generated underneath the MOS structures.

In an embodiment, the first and second current collecting regions act as a first and a second heavily doped contact region having a first conductivity type contacting a semiconductor well having the same first conductivity type, and the current emitting region acts as a heavily doped active region having a second conductivity type opposite to the first conductivity type. A PN junction is formed between the semiconductor well of the first conductivity type and the current emitting region of the second conductivity type. In this case a lateral magnetodiode is obtained. The first MOS structure is located between the first current collecting region having the first conductivity type and the current emitting region having the second conductivity type, and the second MOS structure is located between the current emitting region having the second conductivity type and the second current collector region having the first conductivity type. Additionally a third MOS structure, having a third gate terminal, is located between a first isolation region and the first current collecting region and a fourth MOS structure, having a fourth gate terminal, is located between the second current collecting region and a second isolation region. The additional third and fourth MOS structures may further prevent the unwanted formation of material imperfections, thus reducing the imbalance of the currents flowing from the current emitting region towards the first and the second current collecting regions. The sensitivity of the magnetodiode may be improved by biasing the first, the second, the third and the fourth gate terminals with a negative voltage with respect to the voltage applied to the first and second current collecting regions. This has the effect of increasing the deflection of the currents flowing from the current emitting region to the first and second current collecting regions in a direction perpendicular to the direction of the magnetic field. A further sensitivity improvement may be achieved by forward biasing in high injection regime the PN junction formed between the semiconductor well of the first conductivity type and the current emitting region of the second conductivity type. In this way a higher current is deflected in the semiconductor well, thus increasing the sensitivity of the lateral magnetodiode.

In an embodiment, the first and second current collecting regions act as a first and a second heavily doped active region having a first conductivity type and the current emitting region acts as a heavily doped contact region having a second conductivity type opposite to the first conductivity type and contacting a semiconductor well of the same second conductivity type. In this case a first PN junction of the lateral magnetodiode is formed between the first current collecting region and the semiconductor well and a second PN junction is formed between the second current collecting region and the semiconductor well. Sensitivity may be improved by forward biasing in high injection regime the first and the second PN junctions.

In an embodiment, the first and second current collecting regions act as a first and a second heavily doped contact region having a first conductivity type contacting a semiconductor well having the same first conductivity type, and the current emitting region acts as a heavily doped contact region having the same first conductivity type. In this case a lateral magnetoresistor is obtained. The semiconductor well acts as a body of the magnetoresistor. MOS structures may be in between the current emitting region and the current collecting regions to reduce material imperfections. In order to improve the sensitivity of the magnetoresistor, the gate terminals of these MOS structures may be biased with a negative voltage with respect to the voltage applied to the semiconductor well. In this case a depletion layer is formed underneath the MOS structures, thus increasing the effective vertical deflection length of the majority charge carriers flow.

BRIEF DESCRIPTION OF THE DRAWINGS

The invention will now be further described with reference to the accompanying drawings, in which like references designate like items throughout the various figures, and in which:

FIG. 9b shows a schematic representation of the embodiment of the semiconductor magnetic field sensor shown in FIG. 8a FIG. 9c shows a top view of the embodiment of the semiconductor magnetic field sensor shown in FIG. 9a, FIG. 10a shows a cross section of an embodiment of a semiconductor magnetic field sensor including a lateral magnetoresistor in silicon on insulator technology, FIG. 10b shows a top view of the embodiment of the semiconductor magnetic field sensor shown in FIG. 10a.

DETAILED DESCRIPTION OF EMBODIMENTS

Figure 1A:
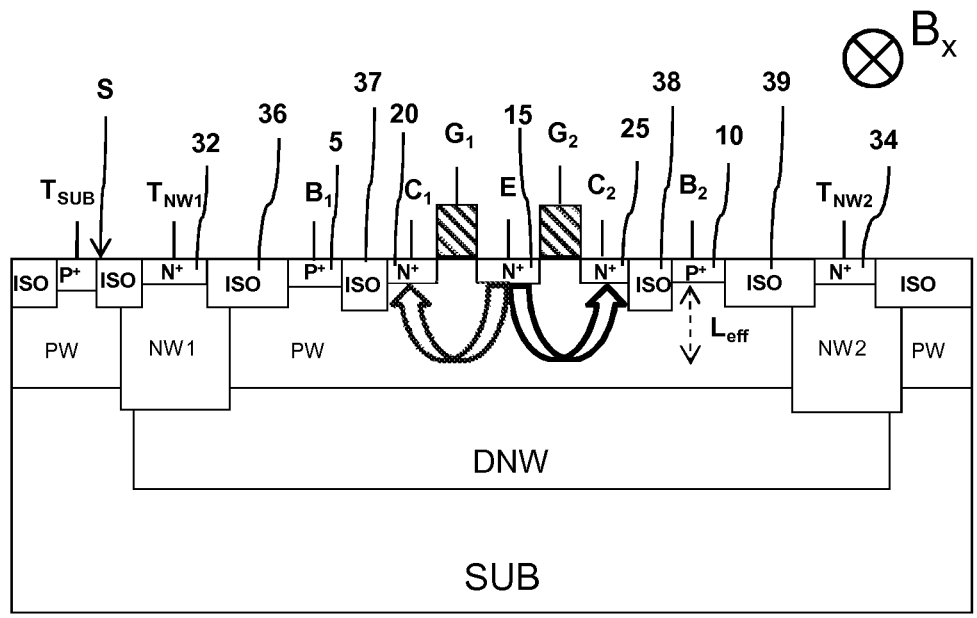
FIG. 1a shows a cross section of an embodiment of a semiconductor magnetic field sensor according to the invention including a lateral NPN bipolar magnetotransistor in a conventional baseline CMOS technology.
Figure 1B:
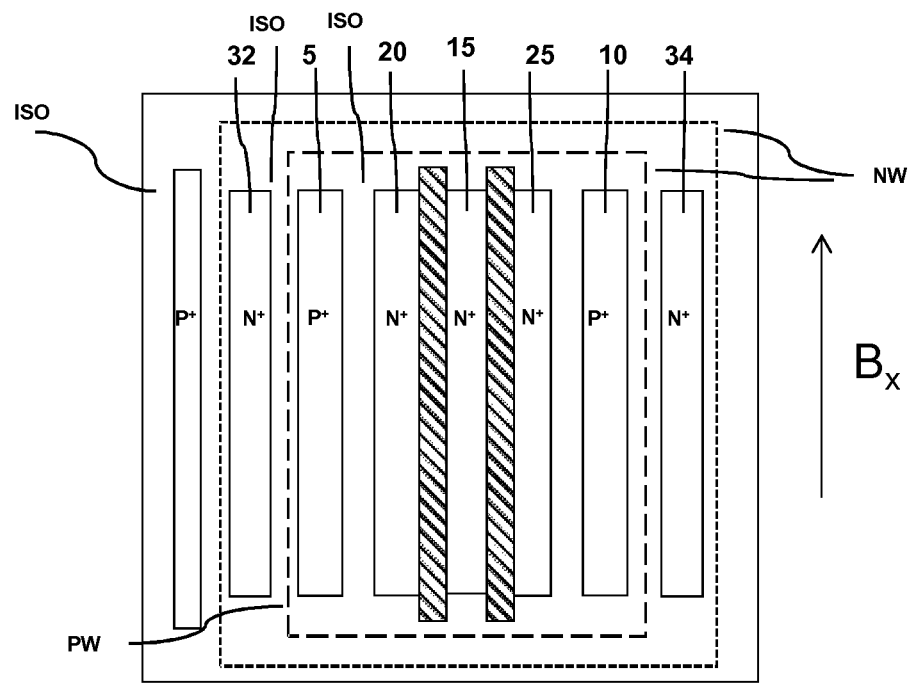
FIG. 1b shows a top view of the embodiment of the semiconductor magnetic field sensor shown in FIG. 1a, FIG. 2a shows a cross section of an embodiment of a semiconductor magnetic field sensor including a lateral NPN bipolar magnetotransistor in silicon on insulator technology.

FIG. 1a and FIG. 1b show an embodiment of a semiconductor magnetic field sensor according to the invention and including a lateral NPN bipolar magnetotransistor implemented in a conventional baseline CMOS technology, which is generally a triple-well technology. FIG. 1a shows a cross section of the lateral NPN bipolar magnetotransistor, while FIG. 1b shows a top view of the same lateral NPN bipolar magnetotransistor. In FIG. 1a $B_x$ represents a magnetic induction perpendicular to the plane of the drawing, entering said plane and parallel to the surface S of the chip as also indicated by the arrow in FIG. 1b.

The semiconductor magnetic field sensor includes a p-type substrate layer SUB that is contacted via a substrate contact region $P^+$ connected to a substrate terminal $T_{SUB}$ (which is normally grounded). In a semiconductor P-well PW a lateral NPN bipolar magnetotransistor is formed. The lateral NPN bipolar magnetotransistor has a first heavily doped p-type base contact region 5 and a second heavily doped base contact region 10 connected, respectively, to a first base terminal $B_1$ and to a second base terminal $B_2$. The semiconductor P-well PW acts as a base for the lateral NPN bipolar magnetotransistor. In the semiconductor P-well PW, the lateral NPN bipolar magnetotransistor has a heavily doped n-type emitter region 15 which acts as an emitter. The emitter region 15 is connected to an emitter terminal E. The collector of the lateral NPN bipolar magnetotransistor is formed in the semiconductor P-well PW by a first heavily doped n-type collector region 15 and by a second heavily doped n-type collector region 25 connected, respectively, to a first collector terminal $C_1$ and to a second collector terminal $C_2$. A deep semiconductor N-well DNW is contacted on two opposite sides of the emitter region 15 by N-well regions NW1 and NW2. The N-well regions NW1 and NW2 form a ring NW around the P-well PW as indicated by the path delimited by the dashed lines of FIG. 1b and are connected to terminals $T_{NW1}$ and $T_{NW2}$ via respective highly doped n-type contact regions 32 and 34. In FIG. 1a isolation regions with isolation material ISO are shown in multiple locations of the semiconductor magnetic field sensor: between the heavily doped p-type substrate contact region $P^+$ and the heavily doped n-type region 32, between the first heavily doped p-type base contact region 5 and the heavily doped n-type contact region 32, between the second heavily doped p-type base contact region 10 and the heavily doped n-type contact regions 34, between the first heavily doped p-type base contact region 5 and the first heavily doped n-type collector region 20, between the second heavily n-type doped collector region 25 and the second heavily doped p-type base contact region 10. However between the first collector region 15 and the emitter region 15, and between the emitter region 15 and the second collector region 25, Metal Oxide Semiconductor (MOS) structures are instead placed. In modern CMOS technologies, the metal of the MOS structures may be typically replaced by conductive polysilicon. The MOS structures may typically be self-aligned MOS structures. The self-alignment of these structures is achieved by growing a thin silicon dioxide ($SiO_2$) layer that is subsequently covered by for example a polysilicon layer. The thin silicon dioxide layer and the polysilicon layers are etched away where diffusions (e.g. diffusion regions 5, 10, 15, 20, 25, 32 and 34) may be formed. When diffusions are formed, the thin silicon dioxide ($SiO_2$) layer and the polysilicon layer covering the thin silicon dioxide ($SiO_2$) layer protect the underlying region from being contaminated from (doping) impurities, keeping the MOS structures and the diffusion regions well aligned with each other and the region below the MOS structures free of impurities and imperfections. The isolation regions with isolation material ISO define also areas where no diffusion regions may be formed. The isolation regions with isolation material ISO may be made of silicon dioxide or alternatively of any other type of electrically isolating material (e.g. silicon nitride). The isolation regions with isolation material ISO may be shallow trench isolations (STI) or local oxidation of silicon, also being referred to as LOCOS.

During operation of the lateral NPN bipolar magnetotransistor, the magnetic induction component $B_x$ in-plane with the chip surface S will cause a differential collector current that is proportional to the in-plane component $B_x$. During operation of the lateral NPN bipolar magnetotransistor, a current of electrons (i.e. minority charge carriers in the semiconductor P-well PW) from the emitter region 15 splits between the first collector region 15 and the second collector region 25 and flows through the semiconductor P-well PW. These currents are indicated in FIG. 1a by the two arrows below the emitter region 15 pointing toward the first collector region 15 and the second collector region 25. The amount of imbalance in the split currents is governed by the so-called electromagnetic Lorentz force. For a value of the magnetic induction component $B_x$ substantially close to zero there is no imbalance in the collector currents.

For a value of the magnetic induction component $B_x$ different from zero, an imbalance is created in the split of the current below the emitter region 15 due to a different deflection of the collector currents caused by the applied magnetic field. The resulting imbalance generates a difference in above mentioned collector currents.

One way (not shown in FIG. 1a and FIG. 1b) to measure the differential collector current is for example by connecting a first side of a current bias source to the emitter terminal E. A second side of the current bias source may be connected to a negative supply. The first base terminal $B_1$ and the second base terminal $B_2$ may be connected together to a reference voltage sufficient to forward bias a base emitter junction formed between the base contact regions 5 and 10 and the emitter region 15. In this case if the emitter terminal E is connected to a negative supply and the substrate terminal $T_{SUB}$ is grounded, the base terminals $B_1$ and $B_2$ may be for example connected together to the substrate terminal $T_{SUB}$. A first current meter (e.g. an amperometer) may be connected between the collector terminal $C_1$ and a second positive supply. A second current meter may be (e.g. an amperometer) connected between the collector terminal $C_2$ and the second positive supply. In this configuration the differential collector current may be measured in response to the in-plane magnetic induction $B_x$. There may be many alternative ways to measure the differential collector current: the current meters may be replaced by current to voltage converter (e.g. resistors) in which case voltages across said converters are measured, etc. It is considered well-known to the person skilled in the art to build such measurement circuitry. In the case of the above mentioned measurement circuitry, the output of the semiconductor magnetic sensor will be:

$$\Delta I_c = K \cdot B_x \cdot I_E \cdot \mu_{H_n}$$

wherein $\Delta I_c$ is the differential collector current, $B_x$ is the value of the magnetic induction component in the x direction, $I_E$ is the emitter bias current, $\mu_{H_n}$ is the n-type Hall mobility and K is a constant dependent on geometry and material parameters of the lateral NPN bipolar magnetotransistor and proportional to an effective vertical deflection length $L_{eff}$ (indicated by a double-arrows line in FIG. 1a) of a current flowing in the lateral NPN bipolar magnetotransistor across the semiconductor P-well PW deflected by the magnetic induction component $B_x$.

The difference between the collector current at collector terminal $C_1$ and the collector current at collector terminal $C_2$ divided by the magnetic induction component $B_x$ and further divided by the emitter bias current $I_E$ is a measure of the current sensitivity of the semiconductor magnetic field sensor, i.e.:

$$S_I = \frac{\Delta I_C}{B_x \cdot I_E} = K \cdot \mu_{H_n},$$

wherein $S_I$ is the current sensitivity of the semiconductor magnetic field sensor with respect to the emitter bias current $I_E$, $B_x$ is the value of the magnetic induction component in the x direction, $\mu_{H_n}$ is the n-type Hall mobility and K is a constant dependent on geometry of the lateral NPN bipolar magnetotransistor and processing parameters. The sensitivity of the lateral NPN bipolar magnetotransistor increases with an increase of the effective deflection length $L_{eff}$ perpendicular to a plane defined by the surface S of the semiconductor magnetic field sensor and parallel to the magnetic induction $B_x$. During operation of the semiconductor magnetic field sensor a first gate terminal $G_1$ of a first MOS structure between the first collector region 15 and the emitter region 15 and a second gate terminal $G_2$ of a second self-aligned MOS structure between the emitter region 15 and the second collector region 25 are biased with a negative voltage with respect to the base terminals $B_1$ and $B_2$ voltage, for inducing an accumulation of majority charge carriers (i.e. holes in the example of FIG. 1a) in a region underneath the MOS structures and close to the surface S. The effect of biasing the gate terminal $G_1$ and the gate terminal $G_2$ with a negative voltage with respect to the base terminals $B_1$ is to effectively push minority carriers (i.e. electrons in this example) down below and perpendicularly to the surface S of the semiconductor P-well PW, thus increasing the effective vertical deflection length $L_{eff}$. As a consequence the current sensitivity improves proportionally to the increase of the effective vertical deflection length $L_{eff}$. This effect is more pronounced as the bias voltage applied to the gate terminals $G_1$ and $G_2$ becomes more negative with respect to the voltage applied to the base terminals $B_1$ and $B_2$. For bias voltages applied to the gate terminals $G_1$ and $G_2$ approaching zero, the electron currents flowing from the emitter region 15 and the collector regions 20 and 25 are almost parallel to the surface S of the semiconductor P-well PW. In this case the effective vertical deflection of the electron currents is very low and as a consequence the current sensitivity is also very low. For large negative bias voltages applied to the gate terminals $G_1$ and $G_2$ with respect to the voltage applied to the base terminals $B_1$ and $B_2$, the electron currents are further bended down from the surface S of the semiconductor P-well PW and the current sensitivity becomes higher. The gate terminals $G_1$ and $G_2$ may be preferably connected together and biased with the same negative voltage source. This avoids any unwanted imbalance in the semiconductor magnetic sensor that may cause an offset that needs to be compensated by additional circuitry. The connection between the gate terminals $G_1$ and $G_2$ may be also made on-chip by for example polysilicon routing for a more compact design or alternatively may be made externally to the chip by connecting the gate terminal $G_1$ to gate terminal $G_2$ with a conductive wire.

The characteristics of bipolar devices such as the lateral NPN bipolar magnetotransistor shown in FIG. 1a and FIG. 1b are strongly influenced by the quality of the Si/SiO$_2$ interfaces between the heavily doped contact regions 20, 25, 5 and 10 and the isolation regions with isolation material ISO that may be made of SiO$_2$. Such interfaces may cause a surface recombination current component. The recombination process takes place via traps whose energy levels are distributed through the silicon bandgap. These traps as well as the strain and the stress associated with the isolation regions with isolation material ISO may lead to an imbalance in the above mentioned collector currents at collector terminal $C_1$ and collector terminal $C_2$ of the lateral NPN bipolar magnetotransistor even when the magnetic induction $B_x$ is approaching zero. The imbalance in collector currents when the magnetic induction $B_x$ is zero is denoted as offset. The offset affects negatively the accuracy of the magnetic sensor and needs to be compensated for. In general also other type of material impurities generated during the fabrication phase of the semiconductor magnetic field sensor and affecting the lateral NPN bipolar magnetotransistor may cause offset. MOS structures typically provide better and cleaner oxide-semiconductor interfaces than for example STI structures.

The function of the ring NW shown in FIG. 1b formed by N-well regions NW1 and NW2 is to isolate the semiconductor P-well PW in which the lateral NPN bipolar magnetotransistor is made. In order to fully isolate the lateral NPN bipolar magnetotransistor, the terminals $T_{NW1}$ and $T_{NW2}$ have to be connected to a higher voltage than the base terminals $B_1$ and $B_2$. In this case a PN junction formed by the deep semiconductor N-well DNW and the semiconductor P-well PW is reversed biased. One drawback of this configuration is that the deep semiconductor N-well DNW becomes a good effective third collector for the electrons emitted from the emitter region 15. The effect of this additional third collector is that part of the current emitted from the emitter region 15 is not available for the deflection of the electrons causing the sensitivity of the semiconductor magnetic field sensor to drop. Further to that, a voltage drop caused by the electrons current in the deep semiconductor N-well DNW and an almost constant voltage or a slight voltage drop in the semiconductor P-well PW will make the PN junction DNW-PW forward biased at some local spot, thereby activating a parasitic substrate PNP device formed by the semiconductor P-well PW (p-type emitter), the deep semiconductor N-well DNW (n-type base) and the p-type substrate SUB. The activation of this parasitic PNP device creates a path for the holes into the substrate SUB and generates an additional leakage.

Figure 2A:
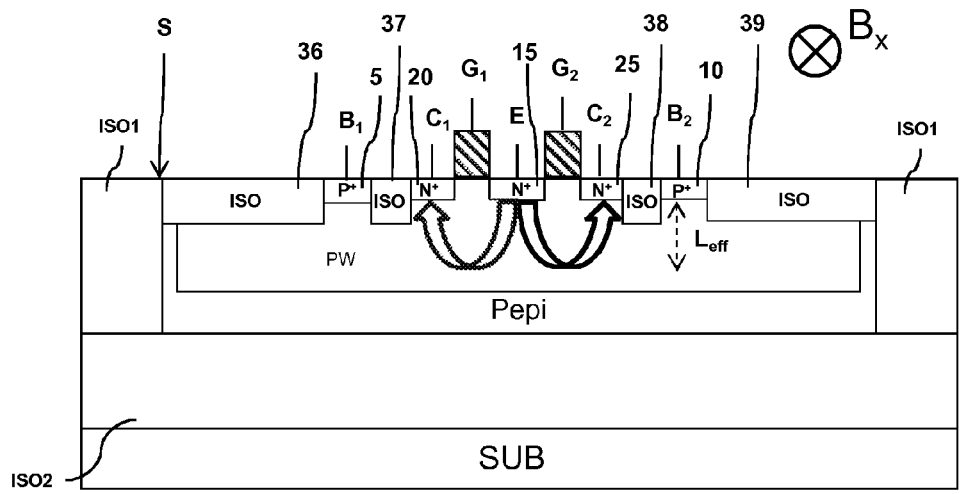
FIG. 2b shows a top view of the embodiment of the semiconductor magnetic field sensor shown in FIG. 2a, FIG. 3a shows a cross section of an embodiment according to the invention of a semiconductor magnetic field sensor including a lateral NPN bipolar magnetotransistor in silicon on insulator technology.
Figure 2B:
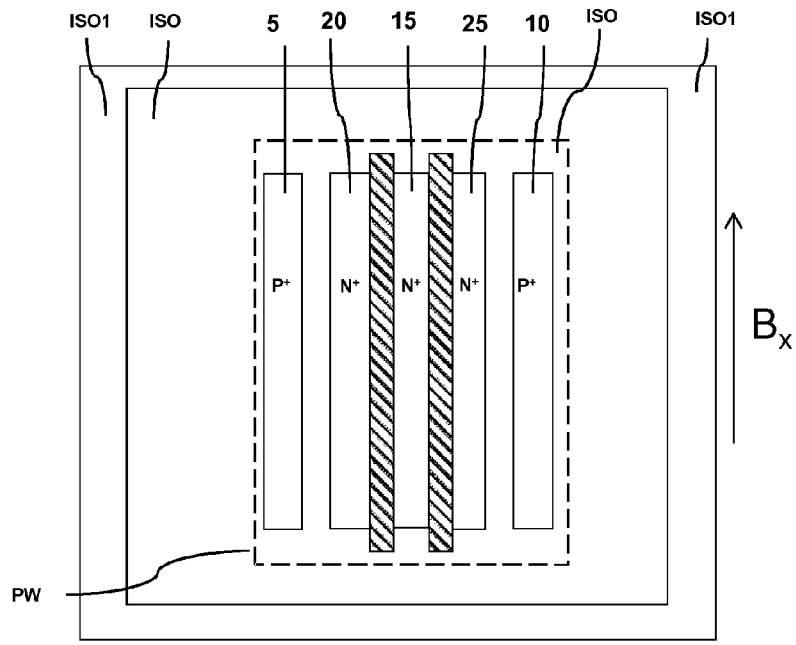

A further improvement of the embodiment of FIG. 1a and FIG. 1b is shown in FIG. 2a and FIG. 2b. FIG. 2a and FIG. 2b show respectively a cross section and a top view of an embodiment of a semiconductor magnetic field sensor including a lateral NPN bipolar magnetotransistor according to the invention. In this embodiment the semiconductor magnetic field sensor includes a lateral NPN bipolar magnetotransistor built in a semiconductor P-well PW in the same way as shown in FIG. 1a and FIG. 1b. In the embodiment of FIG. 2a and FIG. 2b, the semiconductor magnetic field sensor includes an insulation layer ISO2 between the semiconductor P-well PW and the substrate SUB and includes also a lightly doped p-type layer Pepi between the semiconductor P-well PW and the insulation layer ISO2. Additional thick isolation regions ISO1 are placed at the opposite sides of the emitter region 15. Although not shown in FIG. 2a the semiconductor P-well PW may also extend up to the isolation regions ISO1. This would further improve the offset in the semiconductor magnetic field sensor by providing better Si/ISO1 interfaces. The p-type layer Pepi (epitaxial p-type silicon layer or in brief silicon epilayer) is an epitaxial layer deposited on the insulation layer ISO2. Insulation layer ISO2 and thick isolation regions ISO1 may serve to fully isolate the lateral NPN bipolar magnetotransistor from other devices that may be integrated in the same chip. The lateral NPN bipolar magnetotransistor shown in FIG. 2a and FIG. 2b is fabricated using so called Silicon on Insulator (SOI) technology. The substrate layer SUB may be a silicon layer without specific doping properties. Depending on the manufacturing process used in the SOI technology this substrate layer SUB may be denoted as handle wafer (HW) layer. The insulation layer ISO2 is a thick insulation non-conductive layer and avoids that a leakage current of type described for the embodiment of FIG. 1a and FIG. 1b flows to the substrate SUB. The insulation layer ISO2 also ensures that the parasitic PNP of the embodiment of FIG. 1a and FIG. 1b is not present anymore. A further advantage of SOI technology compared to baseline bulk CMOS technologies is that parasitic effects are minimized (i.e., the lateral NPN bipolar magnetotransistor is fully isolated from other devices). The insulation layer ISO2 is typically a Buried Oxide layer (or a BOX layer) made of silicon dioxide (SiO$_2$). The Buried Oxide layer is a common layer to all devices that may be buried in a wafer containing all fabricated chips. The insulation layer ISO2 may be made of another type of insulation material than silicon dioxide, e.g. diamond, aluminum nitride etc. The insulation regions ISO1 are typically called Medium Trenches Isolation (MTI) or Deep Trenches Isolation (DTI) and are used to fully isolate the lateral NPN bipolar magnetotransistor from adjacent devices. The insulation regions ISO1 may be also made of silicon dioxide or other type of insulation material.

As mentioned above Si/SiO$_2$ interfaces may generate offset in the operation of a semiconductor magnetic field sensor. Other than STI/silicon interfaces, also ISO2/silicon interfaces may contribute to the offset in the differential collector current of the lateral NPN bipolar magnetotransistor.

Figure 3A:
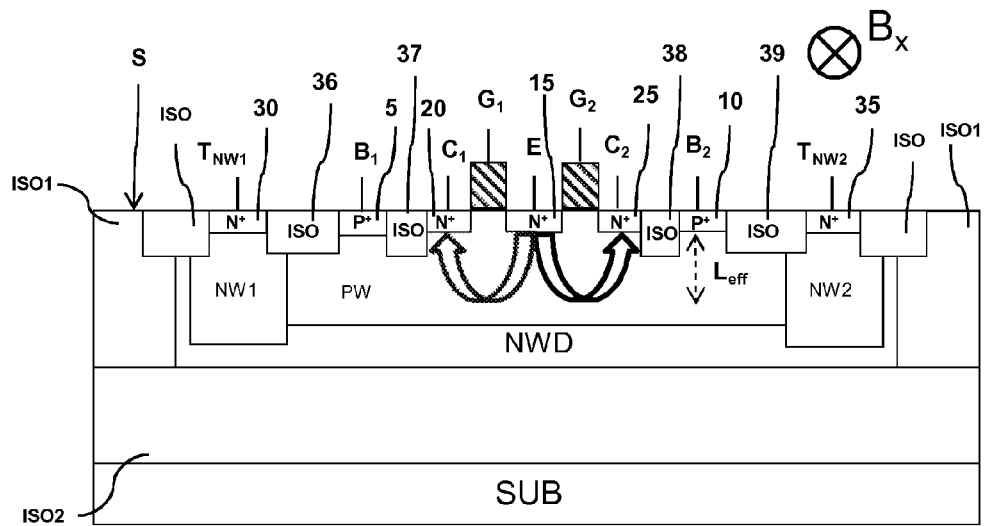
FIG. 3b shows a top view of the embodiment of the semiconductor magnetic field sensor shown in FIG. 3a, FIG. 4a shows a cross section of an embodiment of a semiconductor magnetic field sensor including a lateral NPN bipolar magnetotransistor in silicon on insulator technology.
Figure 3B:
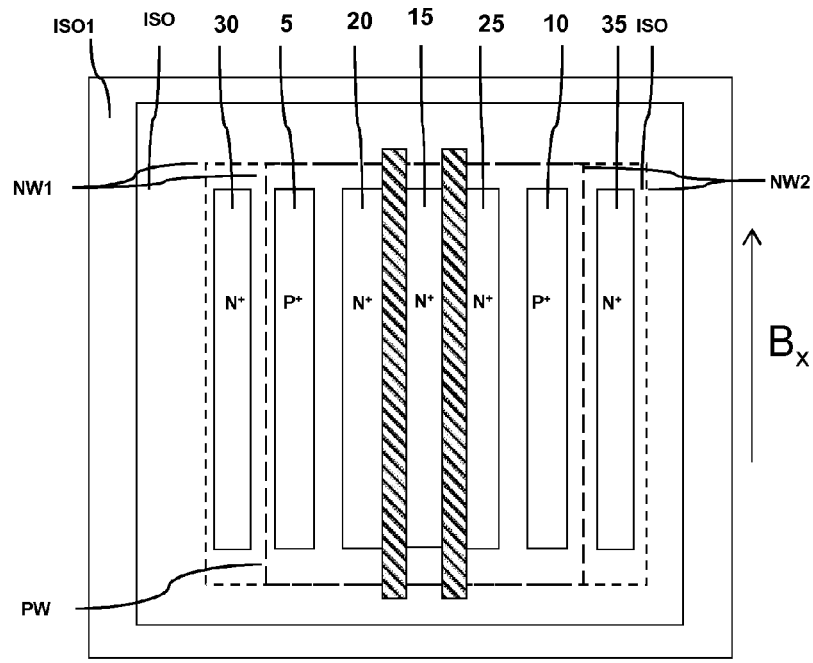

In order to reduce the effect of these ISO2/Pepi interfaces, another embodiment of the semiconductor magnetic field sensor may be used. This embodiment is shown in FIG. 3a and FIG. 3b. This embodiment shows a semiconductor magnetic field sensor similar to the one shown in FIG. 2a and FIG. 2b. The difference is that an n-type semiconductor layer NWD is implanted between the semiconductor P-well PW and the insulation layer ISO2. The n-type semiconductor layer NWD is contacted through a first N-well region NW1 by means of a first heavily doped n-type contact region 30 to a first terminal $T_{NW1}$ and through a second N-well region NW2 by means of a second heavily doped n-type contact region 35 to a second terminal $T_{NW2}$. The n-type semiconductor layer NWD forms with the semiconductor P-well PW a PN junction. This PN junction is reverse biased in order to eliminate the detrimental effect on offset of the ISO2/Pepi interfaces. This is obtained by connecting the terminals $T_{NW1}$ and $T_{NW2}$ to a sufficiently higher voltage with respect to the voltage at the base terminals $B_1$ and $B_2$.

Figure 4A:
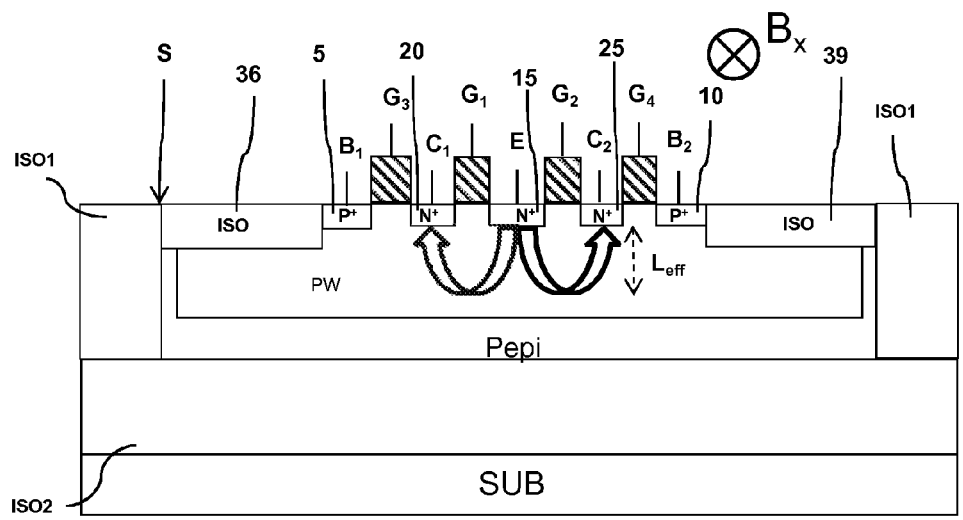
FIG. 4b and FIG. 4c show two different top views of the same embodiment of the semiconductor magnetic field sensor shown in FIG. 4a, FIG. 5a shows a cross section of an embodiment of a semiconductor magnetic field sensor including a lateral NPN bipolar magnetotransistor in silicon on insulator technology.
Figure 4B:
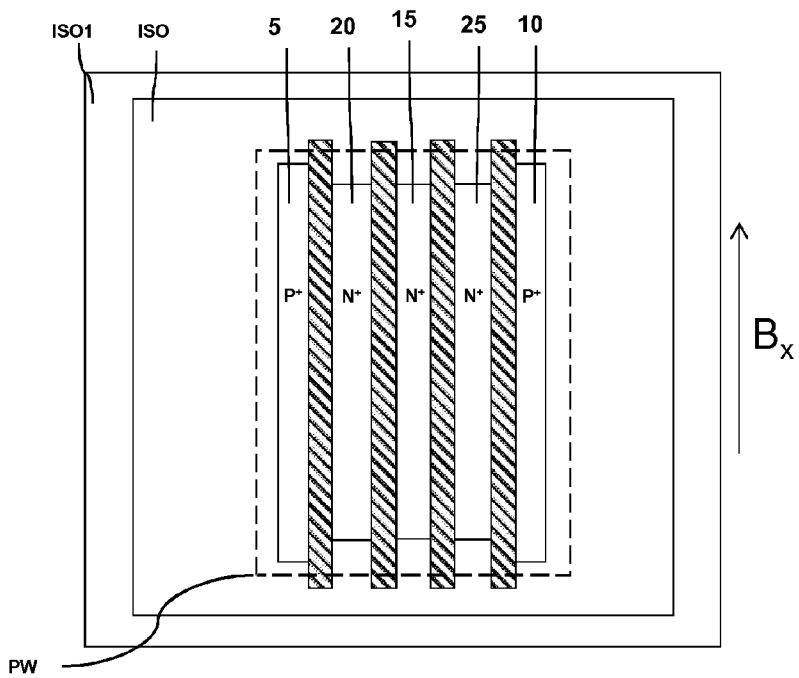

FIG. 4a (cross section) and FIG. 4b (top view) show an embodiment of a semiconductor magnetic field sensor including a lateral NPN bipolar magnetotransistor. This embodiment is similar to the embodiment of FIG. 2a and FIG. 2b. The difference is that a third MOS structure, having a third gate terminal $G_3$ is located between the first base contact region 5 and the first collector region 15 and a fourth MOS structure, having a fourth gate terminal $G_4$, is located between the second collector region 25 and the second base contact region 10. The first MOS structure is limited to the zone between the first collector region 15 and the emitter region 15, and the second MOS structure is limited to the zone between the emitter region 15 and the second collector region 25. During operation of the lateral NPN bipolar magnetotransistor, the third gate terminal $G_3$ and the fourth gate terminal $G_4$ are also biased for inducing an accumulation of majority charge carriers underneath the third and the fourth MOS structures in the semiconductor P-well PW. In this embodiment the third and the fourth MOS structures prevent that PN junctions are formed between the heavily doped p-type base contact regions 5 and 10 and the heavily doped n-type collector regions 20 and 25. The third and the fourth MOS structures replace the isolation regions 37 and 38 with isolation material ISO (e.g. STIs) located between the collector regions 20 and 25 and the base contact regions 5 and 10 shown in FIG. 2a. This improves the offset in the semiconductor magnetic field sensor.

Figure 4C:
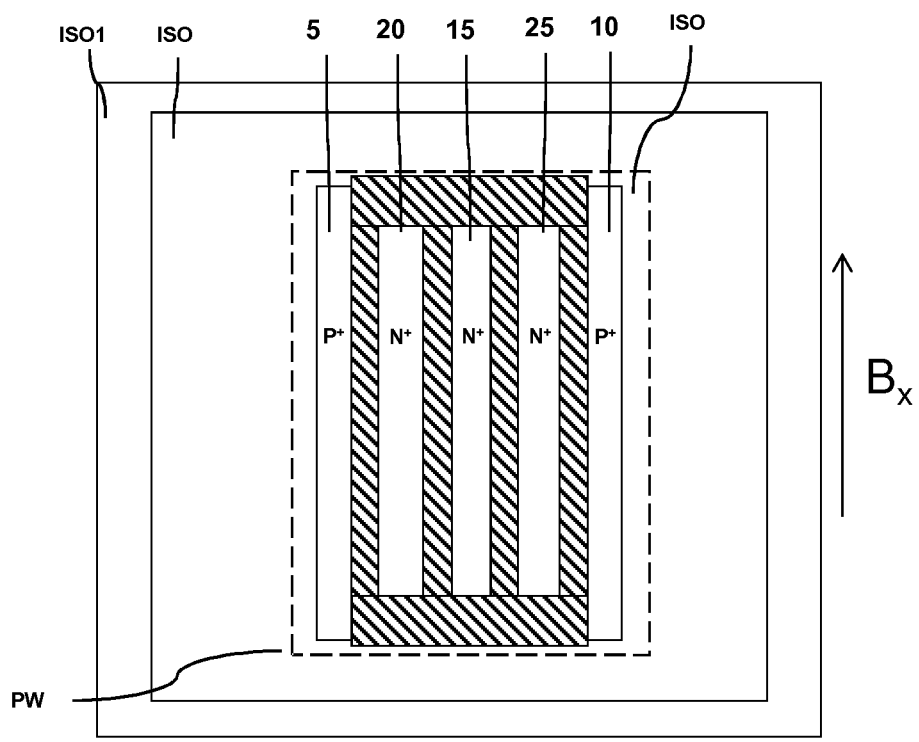

FIG. 4c shows an alternative top view for the same cross section of FIG. 4a. In this alternative top view the remaining ISO/silicon interfaces formed at the far end of the emitter and collector regions 15, 20 and 25 between the isolation regions ISO (e.g. STIs) and the heavily doped n-type emitter and the first and the second collector regions 15, 20 and 25 shown in FIG. 4b, are replaced with MOS structures/silicon interfaces. This further improves the offset.

Figure 5A:
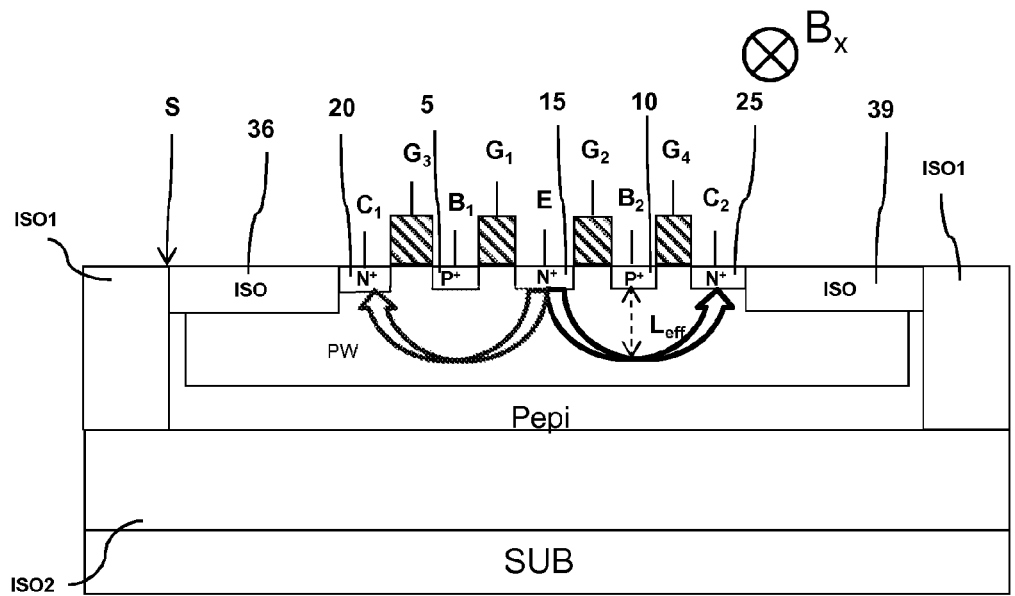
FIG. 5b shows a top view of the embodiment of the semiconductor magnetic field sensor shown in FIG. 5a, FIG. 6a shows a cross section of an embodiment of a semiconductor magnetic field sensor including a lateral NPN bipolar magnetotransistor in silicon on insulator technology.
Figure 5B:
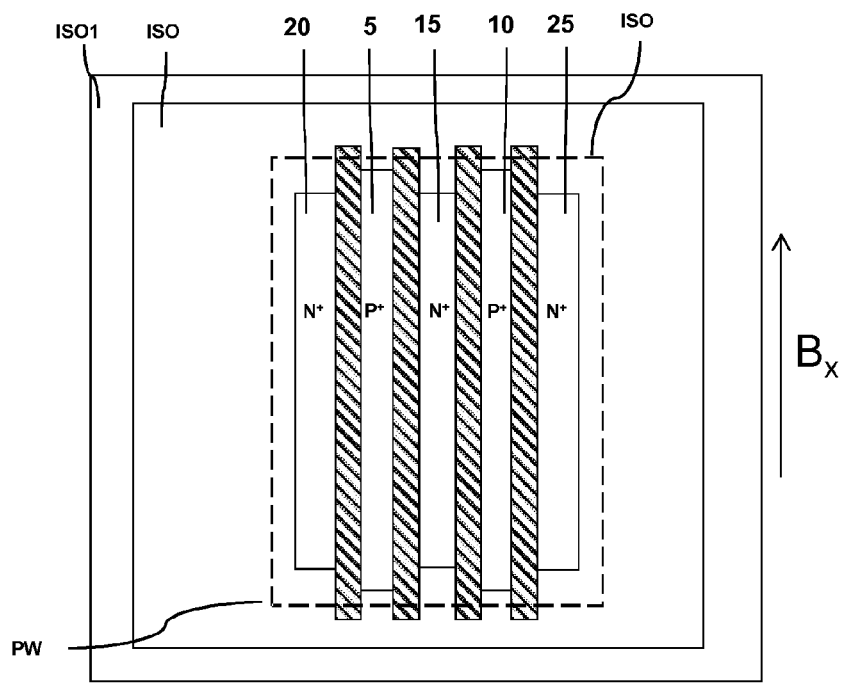

FIG. 5a (cross section) and FIG. 5b (top view) show an alternative embodiment of a semiconductor magnetic field sensor including a lateral NPN bipolar magnetotransistor. This embodiment contains four MOS structures as the embodiment shown in FIG. 4a and FIG. 4b. The difference is that the first heavily p-type doped base contact region 5 is now located between the first heavily n-type doped collector region 15 and the heavily n-type doped emitter region 15, and the second heavily p-type doped base contact region 10 is located between the heavily n-type doped emitter region 15 and the second heavily n-type doped collector region 25. The additional MOS structures present between the emitter region 15 and the collector regions 20 and 25 increase further the effective vertical deflection length $L_{eff}$ of the currents flowing from the emitter region 15 towards the collector regions 20 and 25 deflected by the magnetic induction component $B_x$.

Figure 6A:
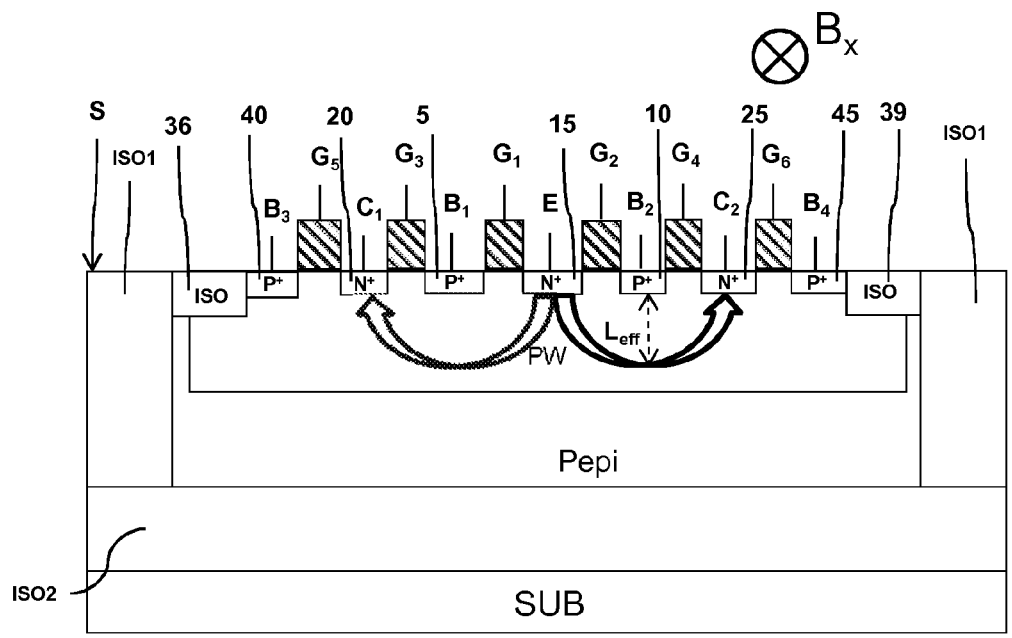
FIG. 6b shows a top view of the embodiment of the semiconductor magnetic field sensor shown in FIG. 6a, FIG. 7a shows a cross section of an embodiment of a semiconductor magnetic field sensor including a lateral NPN bipolar magnetotransistor in silicon on insulator technology.
Figure 6B:
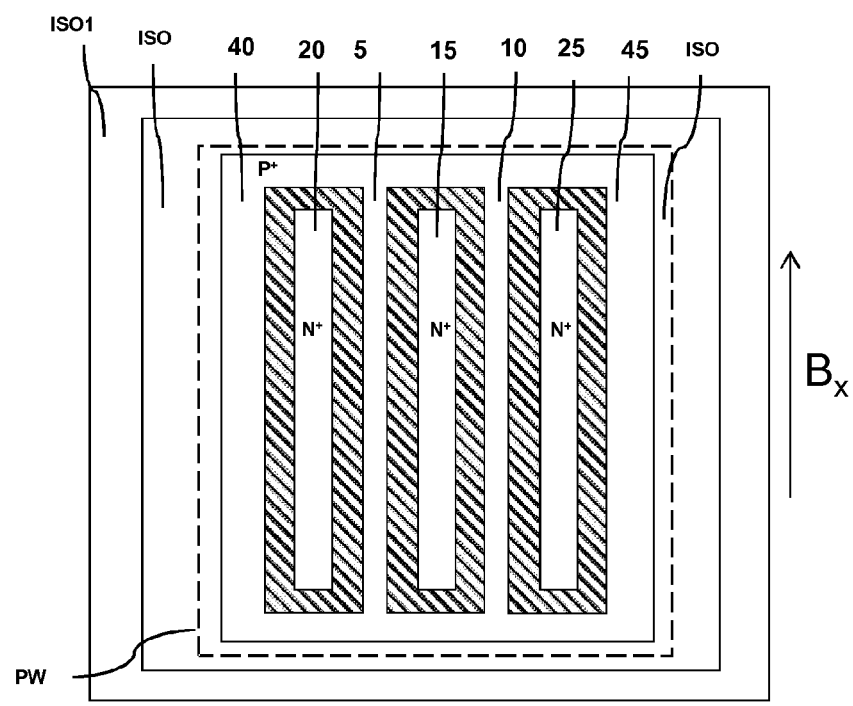

FIG. 6a and FIG. 6b show respectively a cross section and a top view of an embodiment of a semiconductor magnetic field sensor including a lateral NPN bipolar magnetotransistor. The lateral NPN bipolar magnetotransistor of FIG. 6a and FIG. 6b has two extra heavily doped p-type base contact regions 40 and 45, having respectively terminals $B_3$ and $B_4$. The heavily doped p-type base contact region 40 is located between a first isolation region 36 with isolation material ISO and the first collector region 20. The heavily doped p-type base contact region 45 is located between the second collector region 25 and a second isolation region 39 with isolation material ISO. As shown in FIG. 6b the base contact regions 40 and 45 are connected together with the base contact regions 5 and 10 by means of heavily p-type doped semiconductor material P. The semiconductor magnetic field sensor further includes a fifth MOS structure, having a gate terminal $G_5$, located between the third base contact region 40 and the first collector region 20, and a sixth MOS structure, having a sixth gate terminal $G_6$, located between the second collector region 25 and the fourth base contact region 45. The fifth and sixth self-aligned MOS structure are also biased in order to have accumulation of majority charge carriers underneath the fifth and the sixth MOS structures. In FIG. 6a and FIG. 6b all critical ISO/silicon interfaces are replaced with MOS structures. As shown in FIG. 6b the extra base contact regions 40 and 45 are internally connected together to the base contact regions 5 and 10. In this a way a ring of a heavily p-type doped semiconductor material is formed between the gates and the isolation regions 36 and 39. In this way the offset is further reduced by keeping the minority charge carriers (i.e. electrons) away from the interfaces between the collector regions 20 and 25 and isolation regions 36 and 39 (as shown instead in FIG. 5a).

Figure 7A:
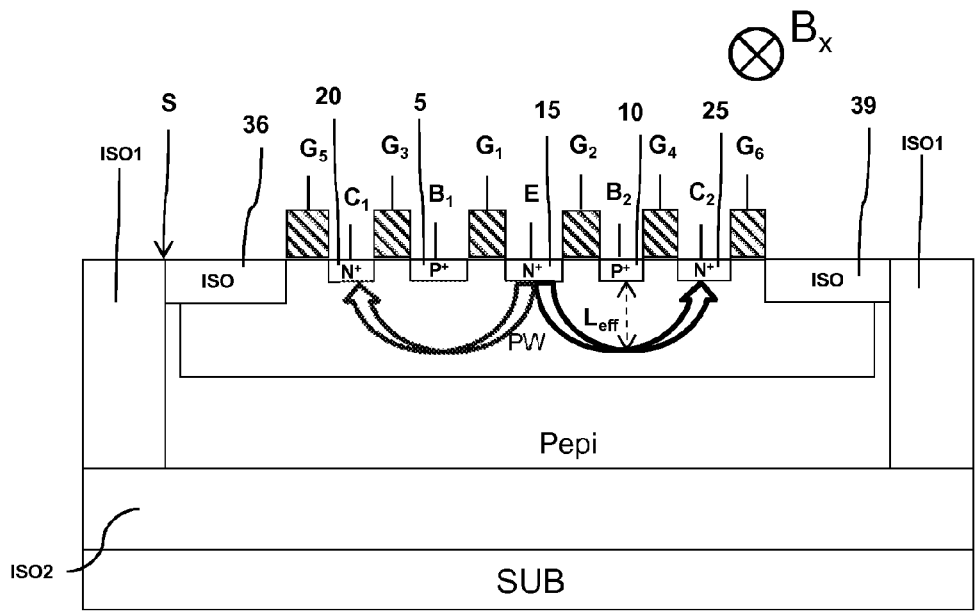
FIG. 7b shows a top view of the embodiment of the semiconductor magnetic field sensor shown in FIG. 7a, FIG. 8a shows a cross section of an embodiment of a semiconductor magnetic field sensor including a lateral magnetodiode in silicon on insulator technology.
Figure 7B:
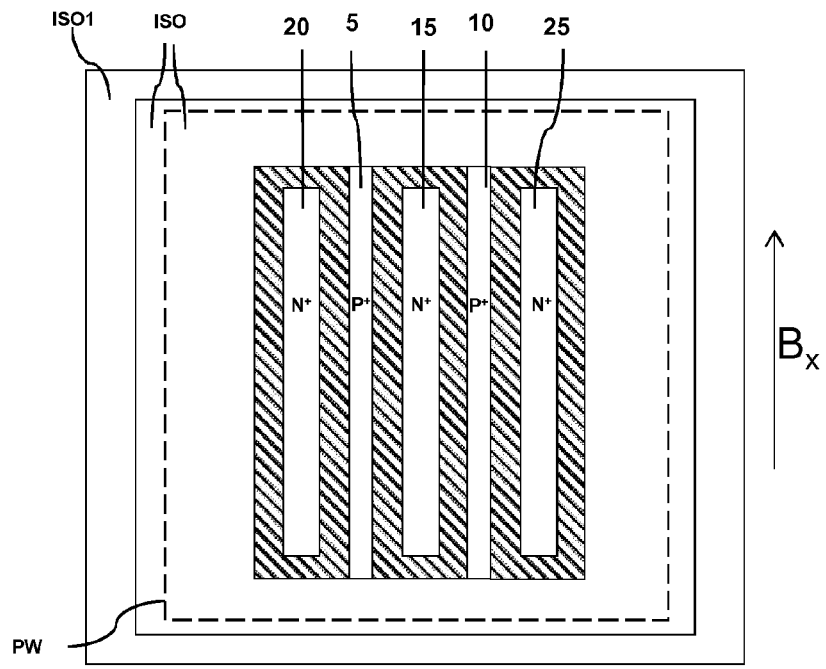

A different embodiment of a semiconductor magnetic field sensor according to the invention is shown in the cross section of FIG. 7a and the top view of FIG. 7b. This embodiment is similar to the embodiment of FIG. 6a and FIG. 6b. In this case however the far ended base contact regions 40 and 45 are missing. In addition, this semiconductor magnetic field sensor is optimized for better sensitivity by having the base contact regions 5 and 10 between the emitter region 15 and the collector regions 20 and 25 respectively.

Figure 8A:
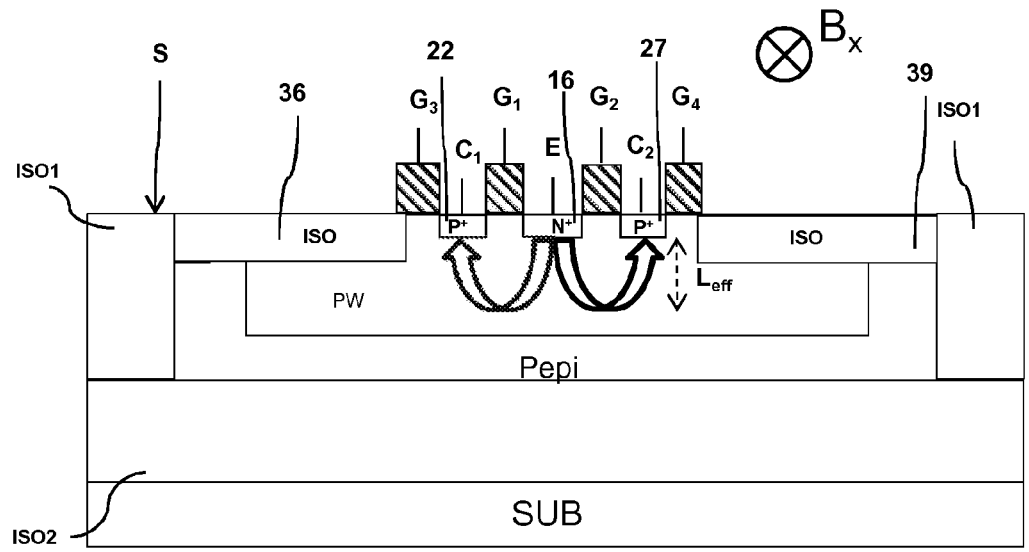
FIG. 8b shows a schematic representation of the embodiment of the semiconductor magnetic field sensor shown in FIG. 8a FIG. 8c shows a top view of the embodiment of the semiconductor magnetic field sensor shown in FIG. 8a, FIG. 9a shows a cross section of an embodiment of a semiconductor magnetic field sensor including a lateral magnetodiode in silicon on insulator technology.
Figure 8B:
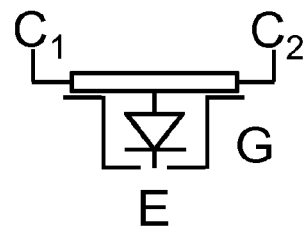
Figure 8C:
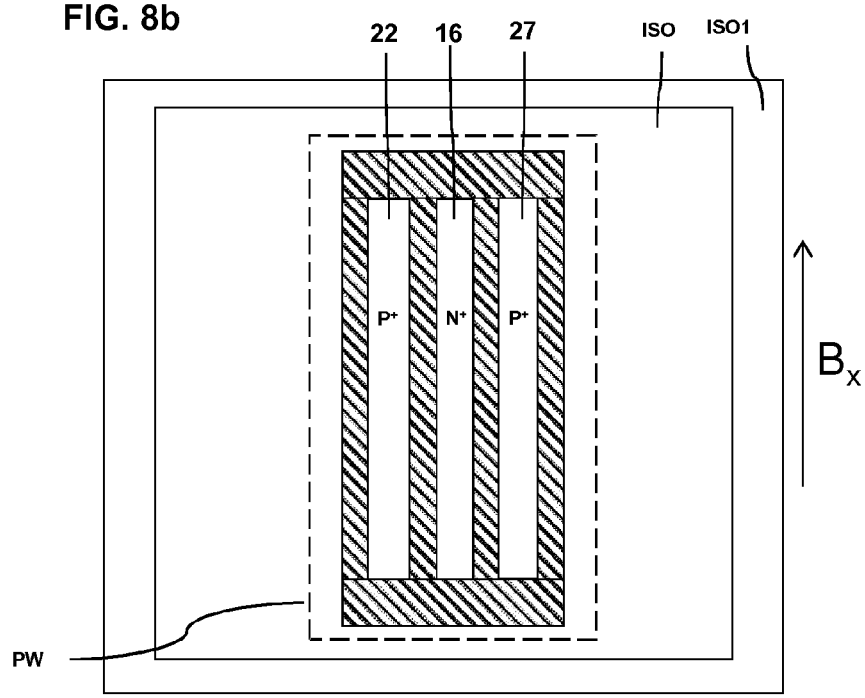

FIG. 8a and FIG. 8c show respectively a cross section and a top view of a semiconductor magnetic field sensor including a lateral magnetodiode. FIG. 8b shows a schematic representation of the lateral magnetodiode. The lateral magnetodiode shown in FIG. 8a and FIG. 8c has a semiconductor P-well PW that acts as a central p-type body, a heavily n-type doped region 16, having an emitter terminal E and two heavily p-type doped contact regions 22 and 27, having respectively a first collector terminal $C_1$ and a second collector terminal $C_2$. The contact regions 22 and 27 serve as contact regions for the semiconductor P-well PW. The heavily n-type doped region 16 and the semiconductor P-well PW form a PN junction of the magnetodiode. A first MOS structure is located between the first contact region 22 and the region 16, a second MOS structure is located between the region 16 and the second contact region 27, a third MOS structure is located between a first isolation region 36 with isolation material ISO and the first contact region 22, and a fourth MOS structure is located between the second contact region 27 and a second isolation region 39 with isolation material ISO. Similar to the operation of the lateral NPN bipolar magnetotransistor, the lateral magnetodiode may be biased with an emitter bias current connected between the emitter terminal E and a negative supply. A first current meter may be connected between the collector terminal $C_1$ and a positive supply. A second current meter may be connected between the collector terminal $C_1$ and the positive supply. The negative and positive supplies are chosen to forward bias the PN junction of the lateral magnetodiode. A differential collector current is measured whenever a value of the magnetic induction $B_x$ is different from zero. The sensitivity of the lateral magnetodiode may be improved by biasing the gate terminals $G_1$, $G_2$, $G_3$ and $G_4$ of the MOS structures with a negative voltage with respect to the voltage at the collector terminal $C_1$ and $C_2$.

Another way to improve sensitivity in lateral magnetodiodes is to bias, during operation, the PN junction in high injection regime. High injection regime is obtained when a large voltage is applied to the collector terminals $C_1$ and $C_2$ with respect to the emitter terminal E. This effect is more pronounced whenever the p-type body of the lateral magnetodiode is lightly p-type doped (i.e. by making the semiconductor P-well PW nearly intrinsic). During high injection regime of the PN junction, minority charge carriers, i.e. electrons in the semiconductor P-well PW, which flow from the region 16 to the first and second contact regions 22 and 27, encounter less resistance. Since the minority charge carriers and the majority charge carriers, i.e. electrons and holes in the semiconductor P-well PW, have opposite velocities, the electromagnetic Lorentz force will deflect both type of charge carriers towards the same direction. In this case a higher current is deflected in the central p-type body, thus increasing the sensitivity of the lateral magnetodiode.

It should be noted that the sensitivity of the described lateral NPN bipolar magnetotransistors may be improved in the same way. By way of example in the case of the lateral NPN bipolar magnetotransistor shown in FIG. 2a and FIG. 2b, a base-emitter PN junction is formed between the semiconductor P-well PW and the heavily n-type doped emitter region 15. In order to achieve a better sensitivity of the lateral NPN bipolar magnetotransistor, the base-emitter PN junction needs to be biased, during operation, in high injection regime. The effect is more pronounced whenever the semiconductor P-well PW of the lateral NPN bipolar magnetotransistor is lightly p-type doped (i.e. by making the semiconductor P-well PW nearly intrinsic).

FIG. 9a and FIG. 9c show respectively a cross section and a top view of a semiconductor magnetic field sensor including a lateral magnetodiode. FIG. 9b shows a schematic representation of the lateral magnetodiode. The lateral magnetodiode shown in FIGS. 9a, 9b and 9c is similar to the lateral magnetodiode shown in FIGS. 8a, 8b and 8c. The difference is that a semiconductor N-well NW acts as a central n-type body for the lateral magnetodiode. In this case, the semiconductor N-well NW with a contact region 17, having an emitter terminal E and a first collector region 23, having a first collector terminal $C_1$ form a first PN junction of the lateral magnetodiode, and the contact region 17 and the second region 28, having a second collector terminal $C_2$, form a second PN junction of the lateral magnetodiode. Also in this case the sensitivity of the lateral magnetodiode may be further improved by forward biasing the first and the second PN junctions in high injection regime to increase the currents deflected in the central n-type body.

Figure 10A:
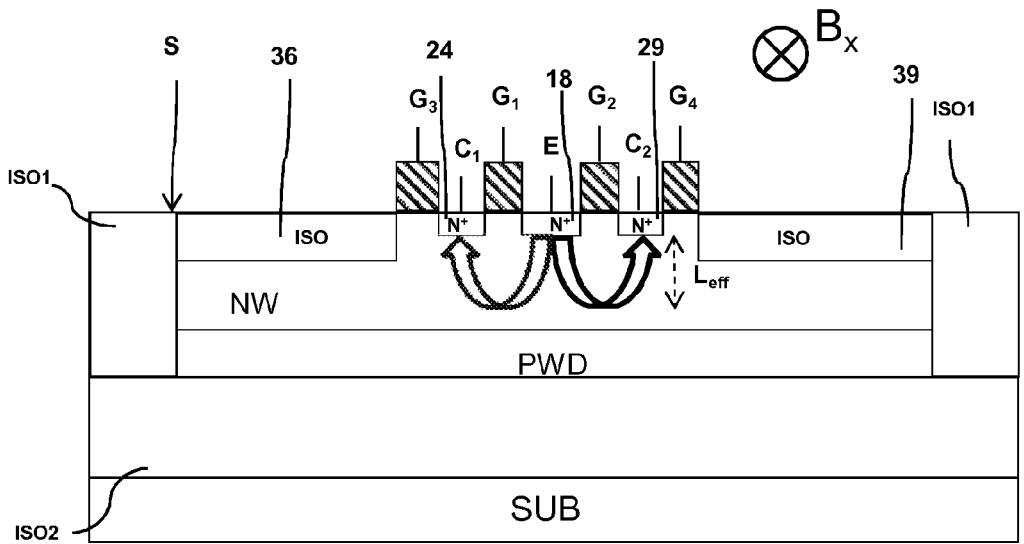
Figure 10B:
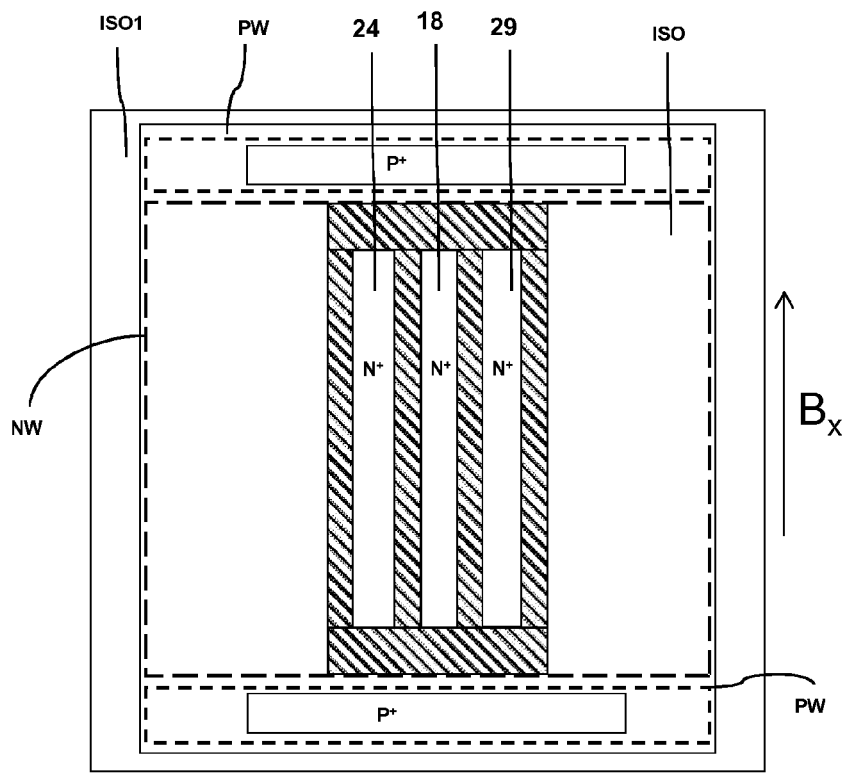

FIG. 10a and FIG. 10b show respectively a cross section and a top view of a semiconductor magnetic field sensor including a lateral magnetoresistor. The lateral magnetoresistor shown in FIG. 10a and FIG. 10b has a semiconductor N-well NW that acts as the n-type body of the lateral magnetoresistor. The lateral magnetoresistor is formed between a heavily n-type doped emitter contact region 18 and two heavily n-type doped collector contact regions 24 and 29. A first MOS structure, having a gate terminal $G_1$, is located between the first collector contact region 24 and the emitter contact region 18, a second MOS structure, having a gate terminal $G_2$, is located between the emitter contact region 18 and the second collector contact region 29, a third MOS structure, having a gate terminal $G_3$, is located between a first isolation region 36 with isolation material ISO and the first collector contact region 24, and a fourth MOS structure, having a gate terminal $G_4$, is located between the second collector contact region 29 and a second isolation region 39 with isolation material ISO. A semiconductor p-type layer PWD is located between the insulation layer ISO2 and the semiconductor N-well NW and contacted with heavily p-type doped $P^+$ contact regions to semiconductor P-well PW regions as shown in FIG. 9b. The sensitivity of the lateral magnetoresistor may be improved by biasing the gate terminals $G_1$, $G_2$, $G_3$ and $G_4$ of the MOS structures with a negative voltage with respect to the voltage at the semiconductor N-well NW. By biasing the gates $G_1$, $G_2$, $G_3$ and $G_4$ in this way, a depletion region is formed in the surface underneath the MOS structures, thereby pushing electrons away from the surface S and increasing the effective vertical deflection length $L_{eff}$ of the majority charge carriers flow. The semiconductor P-well layer PWD forms with the semiconductor N-well NW a PN junction. This PN junction is reverse biased in order to eliminate the detrimental effect on offset of the ISO2/silicon interfaces. This is obtained by applying a higher voltage to the semiconductor N-well NW with respect to the voltage applied to the semiconductor P-well layer PWD by means of the heavily p-type doped contact regions $P^+$ shown in FIG. 10b.

It should be noted that all embodiments discussed may be constructed by their semiconductor inverse (constructed in a semiconductor technology with opposite conductivity). For example in FIG. 2a by replacing a semiconductor P-well PW with a semiconductor N-well NW, and the heavily n-type doped first and second collector regions 20 and 25 with heavily p-type doped first and second collector regions, and the heavily p-type doped first and second base contact regions 5 and 10 with heavily n-type doped first and second base contact regions, and the semiconductor layer Pepi with a semiconductor layer Nepi, a lateral PNP bipolar magnetotransistor instead of the lateral NPN bipolar magnetotransistor is obtained. When the lateral PNP bipolar magnetotransistor in the semiconductor N-well NW is used, a positive voltage instead of a negative voltage with respect to the voltage of the semiconductor N-well NW needs to be applied to the gate terminals of the MOS structures in order to increase the effective vertical deflection length $L_{eff}$ of the minority charge carriers flow (i.e. holes in the semiconductor N-well NW).

The invention claimed is:

1. A semiconductor magnetic field sensor comprising:
   a semiconductor well on top of a substrate layer, comprising:
   a first current collecting region and a second current collecting region, and
   a current emitting region placed between the first current collecting region and the second current collecting region,
   a first MOS structure, having a first gate terminal, located between the first current collecting region and the current emitting region,
   a second MOS structure, having a second gate terminal, located between the current emitting region and the second current collecting region; and
   an insulation layer between the substrate layer and the semiconductor well, and a semiconductor layer between the semiconductor well and the insulation layer.

2. A semiconductor magnetic field sensor according to claim 1, wherein the semiconductor layer is contacted by means of a first heavily doped contact region to a first terminal and by means of a second heavily doped contact region to a second terminal.

3. A semiconductor magnetic field sensor according to claim 1, further comprising a deep semiconductor well buried above the substrate layer and below the semiconductor well, wherein the deep semiconductor well comprises and surrounds the semiconductor well, and wherein the deep semiconductor well is contacted by means of a first heavily doped contact region to a first terminal and by means of a second heavily doped contact region to a second terminal.

4. A semiconductor magnetic field sensor according to claim 1, further comprising a third MOS structure, having a third gate terminal, located between a first isolation region and the first collecting region and a fourth MOS structure, having a fourth gate terminal, located between the second collecting region and a second isolation region.

5. A semiconductor magnetic field sensor according to claim 1, further comprising a first base contact region and a second base contact region in the semiconductor well, a first isolation region, a second isolation region, a third isolation region and a fourth isolation region wherein the first base contact region is located between the first isolation region and the third isolation region, wherein the second base contact region is located between the fourth isolation region and the second isolation region and wherein the first current collecting region, the current emitting region and the second current collecting region are located between the third isolation region and the fourth isolation region.

6. A semiconductor magnetic field sensor according to claim 4, further comprising a first base contact region and a second base contact region in the semiconductor well, the first base contact region being located between the first isolation region and the third MOS structure, and the second base contact region being located between the fourth MOS structure and the second isolation region.

7. A semiconductor magnetic field sensor according to claim 4, wherein the gate terminals $G_1$, $G_2$, $G_3$ and $G_4$ are internally connected by means of electrical conductive material.

8. A semiconductor magnetic field sensor according to claim 1, further comprising a first base contact region and a second base contact region in the semiconductor well, the first base contact region being located between the first current collecting region and the current emitting region, and the second base contact region being located between the current emitting region and the second current collecting region, and further comprising a third MOS structure, having a third gate terminal, located between the first current collecting region and the first base contact region, a fourth MOS structure, having a fourth gate terminal, located between the second base contact region and the second current collecting region.

9. A semiconductor magnetic field sensor according to claim 8 further comprising a fifth MOS structure, having a fifth gate terminal, located between a first isolation region and the first current collecting region, and a sixth MOS structure, having a sixth gate terminal, located between the second current collecting region and a second isolation region.

10. A semiconductor magnetic field sensor according to claim 9, further comprising a third base contact region and a fourth base contact region in the semiconductor well, the third base contact region being located between the first isolation region and the fifth MOS structure and the fourth base contact region being located between the sixth MOS structure and the second isolation region.

11. A semiconductor magnetic field sensor according to claim 9, wherein gate terminal is internally connected to gate terminal, gate terminal is internally connected to gate terminal and gate terminal is internally connected to gate terminal by means of electrical conductive material.

12. A semiconductor magnetic field sensor according to claim 10, wherein the first, the second, the third and the fourth base contact regions are internally connected.

13. A semiconductor magnetic field sensor according to claim 1, wherein the current emitting region has a first conductivity type and the first and second current collecting regions and the semiconductor well have a second conductivity type opposite to the first conductivity type and wherein, in operation, a PN junction formed between the semiconductor well and the current emitting region is forward biased in high injection regime for increasing currents flowing in the semiconductor well from the current emitting region to the first current collecting region and the second current collecting region deflected by the magnetic field.

14. A semiconductor magnetic field sensor according to claim 1, wherein the current emitting region and the semiconductor well have a first conductivity type and the first and second current collecting regions have a second conductivity type opposite to the first conductivity type and wherein, in operation, a first PN junction formed between the first current collecting region and the semiconductor well and a second PN junction formed between the second current collecting regions and the semiconductor well are forward biased in high injection regime for increasing currents flowing in the semiconductor well from the current emitting region to the first current collecting region and the first current collecting region deflected by the magnetic field.

15. A semiconductor magnetic field sensor according to claim 1, further comprising in the semiconductor well a first base contact region and a second base contact region having a first conductivity type, wherein the semiconductor well has the same first conductivity type and the current emitting region and the first and second current collecting regions have a second conductivity type opposite to the first conductivity type and wherein, in operation, a PN junction formed between the current emitting region and the semiconductor well is forward biased in high injection regime for increasing currents flowing in the semiconductor well from the current emitting region to the first current collecting region and the second current collecting region deflected by the magnetic field.

\* \* \* \* \*